United States Patent
Seong et al.

(10) Patent No.: US 8,883,046 B2
(45) Date of Patent: Nov. 11, 2014

(54) CONDUCTIVE METAL INK COMPOSITION AND METHOD FOR FORMING A CONDUCTIVE PATTERN

(75) Inventors: Jie-Hyun Seong, Daejeon (KR); Soo-Yeon Heo, Daejeon (KR); Jong-Taik Lee, Daejeon (KR); Kyoung-Su Jeon, Seoul (KR); Sang-Ho Kim, Daejeon (KR); Ji-Young Hwang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 122 days.

(21) Appl. No.: 13/392,831

(22) PCT Filed: Aug. 24, 2010

(86) PCT No.: PCT/KR2010/005652
§ 371 (c)(1),
(2), (4) Date: May 3, 2012

(87) PCT Pub. No.: WO2011/025229
PCT Pub. Date: Mar. 3, 2011

(65) Prior Publication Data
US 2012/0207918 A1  Aug. 16, 2012

(30) Foreign Application Priority Data

Aug. 28, 2009  (KR) .................. 10-2009-0080374
Aug. 24, 2010  (KR) .................. 10-2010-0081972

(51) Int. Cl.
| | | |
|---|---|---|
| *H01B 1/02* | (2006.01) | |
| *H01B 1/22* | (2006.01) | |
| *B05D 5/12* | (2006.01) | |
| *H05K 1/09* | (2006.01) | |
| *C09D 11/033* | (2014.01) | |
| *C09D 11/037* | (2014.01) | |
| *C09D 11/36* | (2014.01) | |
| *C09D 11/52* | (2014.01) | |
| *H01L 51/00* | (2006.01) | |
| *H05K 3/12* | (2006.01) | |

(52) U.S. Cl.
CPC .............. *C09D 11/52* (2013.01); *C09D 11/033* (2013.01); *H05K 1/095* (2013.01); *H05K 2203/0143* (2013.01); *H01B 1/22* (2013.01); *H05K 3/1275* (2013.01); *C09D 11/037* (2013.01); *C09D 11/36* (2013.01); *H05K 1/097* (2013.01); *H01L 51/0022* (2013.01)
USPC ........... 252/512; 252/513; 252/514; 252/515; 427/123; 174/257

(58) Field of Classification Search
USPC .............................................. 252/500–521.6
See application file for complete search history.

(56) References Cited

U.S. PATENT DOCUMENTS

| | | | |
|---|---|---|---|
| 4,853,036 A | 8/1989 | Koike et al. | |
| 2007/0009835 A1 | 1/2007 | Yoo et al. | |

(Continued)

FOREIGN PATENT DOCUMENTS

| | | | |
|---|---|---|---|
| JP | 2005-126608 A | 5/2005 | |
| JP | 2006-147202 A | 6/2006 | |

(Continued)

*Primary Examiner* — Harold Pyon
*Assistant Examiner* — Jaison Thomas
(74) *Attorney, Agent, or Firm* — Mckenna Long & Aldridge LLP

(57) ABSTRACT

The present invention relates to a conductive metal ink composition which is properly applied for roll-printing process to form conductive pattern, and the method of preparing a conductive pattern using the same.
The conductive metal ink composition comprises a conductive metal powder; a non-aqueous solvent comprising a first non-aqueous solvent having a vapor pressure of 3 torr or lower at 25° C. and a second non-aqueous solvent having a vapor pressure of higher than 3 torr at 25° C.; and a coatability improving polymer and is coated for forming the conductive pattern by the roll printing method.

11 Claims, 2 Drawing Sheets

(56) References Cited

U.S. PATENT DOCUMENTS

| | | |
|---|---|---|
| 2008/0173615 A1 | 7/2008 | Kim |
| 2008/0206488 A1 | 8/2008 | Chung et al. |
| 2008/0241414 A1* | 10/2008 | Kim et al. .................... 427/466 |
| 2009/0008142 A1 | 1/2009 | Shimizu et al. |
| 2009/0033208 A1* | 2/2009 | Nagayama et al. ........... 313/504 |
| 2010/0021704 A1 | 1/2010 | Yoon et al. |
| 2010/0148131 A1* | 6/2010 | Kotake et al. ................. 252/514 |
| 2013/0264104 A1* | 10/2013 | Jeon et al. .................... 174/257 |

FOREIGN PATENT DOCUMENTS

| | | |
|---|---|---|
| JP | 2008-045035 A | 2/2008 |
| JP | 2009-138030 A | 6/2009 |
| KR | 10-2006-0017686 | 2/2006 |
| KR | 10-2006-0112025 | 10/2006 |
| KR | 10-2006-0130568 A | 12/2006 |
| KR | 10-2008-0029826 | 4/2008 |
| KR | 10-2008-0088712 A | 10/2008 |
| TW | 200800609 | 2/1996 |
| WO | 2008/111484 A1 | 9/2008 |

* cited by examiner

US 8,883,046 B2

CONDUCTIVE METAL INK COMPOSITION AND METHOD FOR FORMING A CONDUCTIVE PATTERN

This application is a National Stage Entry of International Application No. PCT/KR2010/005652, filed Aug. 24, 2010, and claims the benefit of Korean Patent Application Nos. 10-2009-0080374, filed on Aug. 28, 2009, and 10-2010-0081972, filed on Aug. 24, 2010, which are hereby incorporated by reference for all purposes as if fully set forth herein.

TECHNICAL FIELD

The present invention provides a conductive metal ink composition and a method for forming a conductive pattern. More specifically, the present invention provides the conductive metal ink composition which is properly applied for roll-printing process to form conductive pattern, and the method of preparing a conductive pattern using the same.

BACKGROUND ART

Recently, various flat panel display devices have been used widely. To manufacture the flat panel display device, many conductive patterns such as electrode, wiring, and EMI-shield filter are formed on a substrate, usually by photolithography.

However, the pattern formation by photolithography requires many steps of coating of the photosensitive material, exposing, developing, etching and etc., thereby making the entire process be complex and expensive.

Therefore, there are increasing focuses on the method of preparing the conductive pattern using inkjet printing method, roll printing method and etc. Particularly, the roll printing method attracts more attention, because it has an advantage in making the fine conductive pattern which is very difficult to form by using the inkjet printing method. In order that good conductive pattern is obtained by using the roll printing method, the conductive ink composition to be used must have proper properties such as a low initial viscosity to be well coated on the roller, and a property being satisfactorily transferred to the substrate in a desired pattern.

However, a conductive ink composition which is satisfactory enough to form a fine conductive pattern by the roll printing method cannot be developed as yet.

DISCLOSURE

Technical Problem

The present invention provides a conductive metal ink composition which is properly applied for a roll printing process to form conductive pattern, and a method of preparing a conductive pattern.

In addition, the present invention provides a method of preparing a fine conductive pattern by using the conductive metal ink composition.

Technical Solution

The present invention provides a conductive metal ink composition comprising a conductive metal powder; a non-aqueous solvent comprising a first non-aqueous solvent having a vapor pressure of 3 torr or lower at 25° C. and a second non-aqueous solvent having a vapor pressure of higher than 3 torr at 25° C.; and a coatability improving polymer.

The present invention provides also a method of forming a conductive pattern, comprising the steps of:
coating a conductive metal ink composition on a roller;
forming a pattern of the ink composition corresponding to the conductive pattern on the roller, by contacting the roller with a cliché which has intaglio pattern corresponding to the conductive pattern;
transferring the pattern of the ink composition on the roller onto a substrate; and
sintering the transferred pattern on the substrate.

The conductive metal ink composition and the method of preparing conductive pattern using the same according to the present invention will be described in more detail.

In accordance with an embodiment, there is provided a conductive metal ink composition comprising a conductive metal powder; a non-aqueous solvent comprising a first non-aqueous solvent having a vapor pressure of 3 torr or lower at 25° C. and a second non-aqueous solvent having a vapor pressure of higher than 3 torr at 25° C.; and a coatability improving polymer, and wherein the composition is used for forming a conductive pattern, by being printed on a substrate with a roll-printing process.

The conductive metal ink composition includes as the media the first non-aqueous solvent and the second non-aqueous solvent, which have different vapor pressure at room temperature. The first and the second non-aqueous solvents show different volatile properties due to the different vapor pressure, and particularly, the second non-aqueous solvent has higher vapor pressure and volatile property than those of the first non-aqueous solvent at room temperature. Therefore, the conductive metal ink composition including the first and the second non-aqueous solvents shows low viscosity and maintains uniform composition in the media including the including the first and the second non-aqueous solvents for a storage time, until it is coated on the roller in the roll printing process. Thus, the conductive metal ink composition can be easily coated on the roller uniformly.

In addition, when the conductive metal ink composition is exposed to air, the second non-aqueous solvent begins to volatilize shortly after the exposure due to its high volatility, and thus the viscosity of the composition gets higher sharply in several minutes. The ink composition coated on the roller can be easily patterned as the desired patterning shape. In addition, even after patterning, the ink composition cannot run down from the roller, and can maintain the good pattern shape.

Accordingly, if the roll printing is performed by using the conductive metal ink composition, the desired pattern can be transferred to the substrate with maintaining the good pattern shape and fine conductive pattern can be satisfactorily formed.

Meanwhile, the conductive ink composition can include the coatability improving polymer. As described in more detail hereinafter, the coatability improving polymer acts as a binder in the ink composition and provides the adhesiveness, resulting in satisfactory coating and transferring of the ink composition in the preparation process of conductive pattern. Thus, the inclusion of the coatability improving polymer in the ink composition makes it possible to properly apply the composition to the roll printing method, thereby producing the fine conductive pattern.

In particular, by including the suitable coatability improving polymer such as phenol resin in the ink composition, it is possible to coat the ink composition well, and to reduce largely the defect occurrence such as pinhole on the coated ink composition. In addition, the ink composition coated on the roller has hard film property in some extent and sticky adhesiveness, and thus, can be transferred to the substrate favorably. That is, even if the roller contacts with the substrate at relatively low pressure, all ink composition coated on the roller can be transferred to the substrate, and the ink composition can be dried at a shorter time. In addition, in the step of forming the pattern on the roller by contacting the roller with the cliché, the ink composition can be selectively removed by only contacting part of cliché, due to the proper acting of the coatability improving agent, to finely form the desired pattern of the ink composition on the roller (see FIG. 1 (b)). As a result, the ink composition on the roller can be transferred to the substrate in more precise pattern.

In contrast, when the ink composition does not include the coatibility improving polymer, the ink composition may have an excessively low adhesiveness or only hard film property. Thus, the precise pattern of the ink composition cannot be formed on the roller, or be transferred to the substrate.

For example, in the case that the coatibility improving polymer is not contained in the ink composition, the ink composition has an excessively low adhesiveness, resulting in transfer of only a part of ink composition to the substrate (see FIG. 1(c)). Thus, it is difficult to satisfactorily transfer and pattern formation on the substrate, such as to reduce the thickness of the transferred ink composition and to break a part of pattern breaks. For reference, FIG. 1(c1) shows that the ink composition cannot be transferred completely and remains on the roller. FIG. 1(c2) is a drawing comparing the complete transfer of the ink composition with incomplete transfer.

In addition, when the proper coatibility improving polymer is not used, the excessively hard film property of the ink composition removes the ink composition on the broader part than the contacting part of the cliché, or the crack on the ink composition remaining on the roller can occur due to the contacting pressure between the roller and cliché (see FIG. 1(a)). As a result, the precise pattern cannot be formed on the roller, and the substrate. For reference, FIG. 1(a1) shows that the pattern cannot be properly formed, as the ink composition on the roller is removed at an excessively broad area. In FIG. 1 (a2), the crack on the ink composition remaining on the roller causes the crack on the substrate.

Hereinafter, each component of the conductive metal ink composition according to an embodiment of the present invention will be described in detail.

Firstly, the conductive metal powder is contained in the ink composition as a basic component to give the conductivity. The conductive metal powder can be any metal powder with electrical conductivity and for examples, includes at least one selected from the group consisting of silver (Ag), copper (Cu), gold (Au), chrome (Cr), aluminum (Al), tungsten (W), zinc (Zn), nickel (Ni), iron (Fe), platinum (Pt) and lead (Pb). In order that the conductive pattern prepared from the ink composition shows excellent and uniform conductivity due to the uniform distribution of the metal powder, the metal powder have an average particle diameter of nano-scale. For example, the average diameter of the metal powder can be about 1 to 100 nm, preferably about 5 to 70 nm, or more preferably about 10 to 50 nm.

The conductive metal powder can be contained at an amount of about 15 to 30 wt %, preferably about 20 to 30 wt %, or more preferably about 23 to 30 wt %, on the basis of total weight of the composition, where the total weight is sum of the weights of conductive metal powder, the first non-aqueous solvent, the second non-aqueous solvent, the coatability improving polymer, and optionally the surfactant. If the amount of conductive metal powder is excessively small, the conductivity of conductive pattern formed from ink composition may be not sufficient. On the other hand, if it exceeds the amount, the poor property of the conductive pattern or the non-uniform coating of the composition can be obtained due to the poor distribution of the metal powder in the ink composition.

The conductive metal ink composition includes the first non-aqueous solvent and the second non-aqueous solvent. The first non-aqueous solvent has a vapor pressure of 3 torr or lower at 25° C. and a relatively low volatility, and acts a dispersing agent before sintering.

The first non-aqueous solvent can be any solvent having a vapor pressure of 3 torr or lower at 25° C., and the examples of first non-aqueous solvent are at least one or two volatile solvents selected from the group consisting of alcohol-based solvent, glycol-based solvent, polyol, glycol ether-based solvent, glycol ether ester-based solvent, ketone-based solvent, hydrocarbon-based solvent, lactate-based solvent, ester-based solvent, aprotic sulfoxide-based solvent, and nitrile-based solvent, which have a vapor pressure of 3 torr or lower at 25° C. The specific examples of the first non-aqueous solvent are ethylene glycol, propylene glycol, glycerol, propylene glycol propylether, ethylene glycol monophenylether, ethylene glycol monoisopropylether, ethyleneglycol monobutylether, propyleneglycol monobutylether, diethylene glycol monobutylether, diethylene glycol monobutylether acetate, diethylene glycol ethylether, N-methylpyrrolidone, hexadecan, pentadecan, tetradecan, tridecan, dodecan, undecan, decan, DMSO, acetonitrile and butyl cellosolve.

The second non-aqueous solvent is a highly-volatile solvent having a vapor pressure of more than 3 torr at 25° C. As described above, the second non-aqueous solvent maintains a low viscosity and a good coatability on the roller together with the first non-aqueous solvent before coating of the ink composition, it is removed by evaporation to increase the viscosity of ink composition, and makes the pattern be formed and maintained on the roller.

The second non-aqueous solvent can be any solvent having a vapor pressure of higher than 3 torr and the examples are at least one or two volatile solvents selected from the group consisting of alcohol-based solvent, glycol ether-based solvent, glycol ether ester-based solvent, ketone-based solvent, hydrocarbon-based solvent, lactate-based solvent, ester-based solvent, aprotic sulfoxide-based solvent, and nitrile-based solvent which have a vapor pressure of higher than 3 torr at 25° C. The specific examples are at least one or two volatile solvents selected from the group consisting of methanol, ethanol, propanol, isopropanol, n-butanol, t-butanol, pentanol, hexanol, nonan octan, heptan, hexan, acetone, methylethylketone, methylisobutylketone, methyl cellosolve, ethylcellosolve, ethylene glycol dimethylether, ethylene glycol diethylether, propyleneglycol methylether acetate, chloroform, methylene chloride, 1,2-dichloroethan, 1,1,1-trichloroethan, 1,1,2-trichloroethane, 1,1,2-trichloroethene, cyclohexan, tetrahydrofuran, benzene, toluene and xylene.

Each first non-aqueous solvent and the second non-aqueous solvent can be contained at an amount of about 5 to 70 wt % and about 10 to 75 wt %, preferably about 20 to 50 wt % and about 25 to 55 wt %, and more preferably about 25 to 48 wt % and about 30 to 53 wt %, on the basis of total weight of the composition where the total weight is sum of the weights of conductive metal powder, the first non-aqueous solvent, the second non-aqueous solvent, the coatability improving polymer, and optionally the surfactant.

When the amount of first non-aqueous solvent is small, or when the amount of second non-aqueous solvent is excessively large, the drying rate of ink composition becomes high after coating on the roller, thereby making the transfer be difficult. On the other hand, when the amount of the first non-aqueous solvent is larger than the ranges, or when the amount of the second non-aqueous solvent is excessively small, the low drying rate makes the entire process be delayed and makes it difficult to coat the ink composition. On the other hand, when the first non-aqueous solvent and the second non-aqueous solvent are contained at an optimal amount, the process time gets shorter and satisfactory conductive pattern can be obtained in the roll printing of the ink composition.

The conductive metal ink composition includes the coatability improving polymer. As described above, the coatability improving agent acts as a binder in the ink composition and provides the adhesiveness, resulting in satisfactory coating and transferring of the ink composition in the preparation process of conductive pattern. That is, as the conductive ink composition includes the coatability improving agent, it can be coated well on the roller and transferred to the substrate to produce good conductive pattern by roll printing method. In contrast, if the composition does not include the coatability improving agent, the conductive pattern is not properly formed and the linearity of the pattern can deteriorated.

The coatability improving agent can be at least an adhesive polymer selected from the group consisting of epoxy-based polymer, phenol-based polymer, or alcohol-based polymer. Examples of the epoxy-based polymer includes bisphenol A epoxy polymer, bisphenol F epoxy polymer, novolac epoxy resin, flame retarded epoxy resin such as bromo-epoxy resin, alicyclic epoxy polymer, rubber-modified epoxy resin, aliphatic polyglycidyl epoxy resin and glycidylamine epoxy polymer. The examples of phenol-based polymer are novolac phenol resin and resole phenol resin, and the examples of alcohol-based polymer are cellulosic polymer, polyvinylalcohol and ethylene vinyl alcohol. Besides, the examples of coatability improving polymer are ethylenevinylacetate, rosin-based polymer, urethane-based polymer, acrylic polymer, styrene-butadiene-styrene-based polymer, polyester-based polymer and etc.

Any material of the examples which are commercially-available materials, can be used as a coatability improving agent.

Because the ink composition includes the coatability improving agent, the composition shows an excellent coatability on the roller, and a good transferring property to the substrate. Therefore, the ink composition can be applied for the roll printing method to form the fine conductive pattern.

The coatability improving agent can be contained in the ink composition at an amount of about 0.1 to 5 wt %, preferably about 1 to 4 wt %, or more preferably about 2 to 3 wt %, on the basis of total weight of the composition, where the total weight is sum of the weights of conductive metal powder, the first non-aqueous solvent, the second non-aqueous solvent, the coatability improving polymer, and optionally the surfactant. If the amount is excessively small, the coatability and transferring property of ink composition are not sufficient. If the amount is excessively large, the conductive pattern of the ink composition cannot show sufficient conductivity.

Besides the components in the ink composition, the composition can further include a surfactant. The surfactant contained in the ink composition prevents dewetting phenomenon and pinhole occurring, when the ink composition is coated on the roller. As a result, the ink composition can be coated favorably on the roller, so as to form the fine conductive pattern.

The silicon-based surfactant which has been used commonly in the conductive metal ink composition, for example, polydimethyl siloxane can be used as a surfactant, and other kinds of surfactants can be used for the present invention without any limitation.

The surfactant can be used at an amount of about 0.01 to 4 wt %, preferably about 1 to 4 wt %, or more preferably about 2 to 3 wt %, on the basis of total weight of the composition, where the total weight is sum of the weights of conductive metal powder, the first non-aqueous solvent, the second non-aqueous solvent, the coatability improving polymer, and optionally the surfactant. Because the surfactant is contained in the ink composition in the ranges, the ink composition can be easily coated on the roller.

The conductive metal ink composition of the present invention has an initial viscosity of about 10 cPs or lower, preferably about 7 cPs or lower, or more preferably about 5 cPs or lower. Hereinafter, the term, "initial viscosity" means the viscosity while the ink composition is prepared initially and is coated on the roller. More specifically, the term, "initial viscosity" can means the viscosity of the ink composition that is stored after the preparation until the ink composition is coated. Namely, the viscosity is referred to the viscosity of the ink composition, before the ink composition is exposed to air or is coated on the roller. The conductive metal ink composition has such a low viscosity due to the inclusion of the first non-aqueous solvent and the second non-aqueous solvent, resulting in excellent coatability on the roller. After the ink composition is coated on the roller, the viscosity becomes high due to the evaporation of the second non-aqueous solvent with high volatility, thereby forming and maintaining the good pattern on the roller and transferring to the substrate.

Therefore, by applying the conductive metal ink composition for the roll printing method, the fine conductive pattern can be easily formed on the substrate. When the ink composition is applied to the roll printing method, it is possible to form the fine conductive patter having a line width of about 3-80 µm, or preferably 3-40 µm which cannot be achieved by the inkjet printing method. For example, by using the ink composition and the roll printing method, it is possible to satisfactorily obtain very fine conductive pattern having a line width of about 3-10 µm and a gap width of about 3-10 µm which could not be achieved by inkjet printing method.

Thus, the conductive metal ink composition can be printed on the substrate, for examples, a glass substrate according to the roll printing method, to form the conductive pattern, or preferably the electrode element of flat display element. In particular, because the fine conductive pattern can be satisfactorily obtained by using the conductive metal ink composition and the roll printing method, the fine pattern can contribute to the manufacture of the flat panel display with the improved visibility and large area.

In accordance with an embodiment of the present invention, there is provided a method of preparing the conductive pattern. The method of forming a conductive pattern comprises the steps of: coating the conductive metal ink composition on a roller; forming a pattern of the ink composition corresponding to the conductive pattern on the roller by contacting the roller with a cliché which has an intaglio pattern corresponding to the conductive pattern; transferring the pattern of the ink composition on the roller onto a substrate; and sintering the transferred pattern on the substrate.

In the method of forming the conductive pattern, the term, "cliché" means the rough (凹凸) plate which is used to form conductive pattern in a desired shape by applying the ink composition on the roller. The intaglio pattern corresponding to the conductive pattern can be formed on in the cliché.

Referring to the attached drawings, the method of forming the conductive pattern according to the embodiment of the present invention will be described step by step. FIG. 2 is a schematic drawing to briefly show the steps of preparing the conductive pattern according to the roll printing method.

Firstly, the homogeneous ink composition can be prepared by mixing the components and agitating. To remove the impure materials and to form uniform conductive pattern, the ink composition can be further filtered.

Sequentially, the conductive ink composition (22) is coated on the roller (20). The outer surface of the roller (20) can be covered with blanket (21) which may comprise polydimethylsiloxane (PDMS). PDMS can be properly used as blanket (21), because it has better adhesiveness, and elastic, transforming and transferring properties than other polymers. The blanket (21) can be coated by the conductive ink composition which can be provided with an inflow hole (10) of an apparatus of providing the ink composition. At this time, as the second non-aqueous solvent begins to evaporate, the viscosity of ink composition (22) increases sharply.

After coating the ink composition (22) on the blanket (21), the pattern of the ink composition corresponding to the conductive pattern is formed on the roller by contacting the roller with a cliché having the intaglio pattern corresponding to the conductive pattern.

That is, the cliché (30) removes selectively the ink (32) which need not for pattern formation, by contacting with the blanket (21) coated with the ink composition (22), resulting in preparing a desired pattern on the roller corresponding to the conductive pattern. To do so, the cliché (30) has the intaglio pattern corresponding to the conductive pattern on its surface contacting with the blanket (21). Only protruding part (31) of the cliché (30) contacts with the ink composition (22) on the blanket (21), and transfers the ink (32) to the protruding part (31), resulting in removing the ink which is not required to form the conductive pattern.

After forming the pattern of ink composition on the roller, the pattern is transferred to the substrate. The pattern of ink composition is transferred to the substrate (40) by contacting the blanket (21) which the pattern of ink composition is formed on, with the substrate (40) to form desired pattern (41) on the substrate (40).

After transferring step, the conductive pattern on the substrate can be formed by sintering. The sintering step can be performed under the proper conditions that are dependent on the kind of desired conductive pattern. For example, in case that the conductive pattern is used for an electrode pattern of flat display device, the sintering step can be carried out at about 400 to 600° C. for about 5 to 50 minutes, particularly at about 400 to 480° C. for 10 to 40 minutes.

According to the method of preparing the conductive pattern using the roll printing method, the conductive pattern can be formed rapidly and simply on the substrate, compared with photolithography used in the prior art. In addition, when the ink composition is applied to the roll printing method, it is possible to form the fine conductive patter having a line width of about 3-80 μm, or preferably 3-40 μm which cannot be achieved by the inkjet printing method. In particular, by using the ink composition and the roll printing method, it is possible to satisfactorily obtain very fine conductive pattern having a line width of about 3-10 μm and a gap width of about 3-10 μm which could not be achieved by inkjet printing method.

Thus, by applying the ink composition to the roll printing method according to the embodiment of the present invention, the fine conductive pattern with excellent conductivity, for example, the electrode pattern of flat panel display can be satisfactorily formed, and the obtained fine pattern can contribute to the manufacture of the flat panel display with the improved visibility and large area.

Advantage Effect

As described above, the present invention provides a conductive metal ink composition which can be properly applied for roll printing process to form a conductive pattern.

Therefore, by applying the conductive metal ink composition to the roll printing method, it is possible to prepare a fine conductive pattern, for example, a fine electrode pattern of flat panel display element.

EXAMPLES

Figure 1:
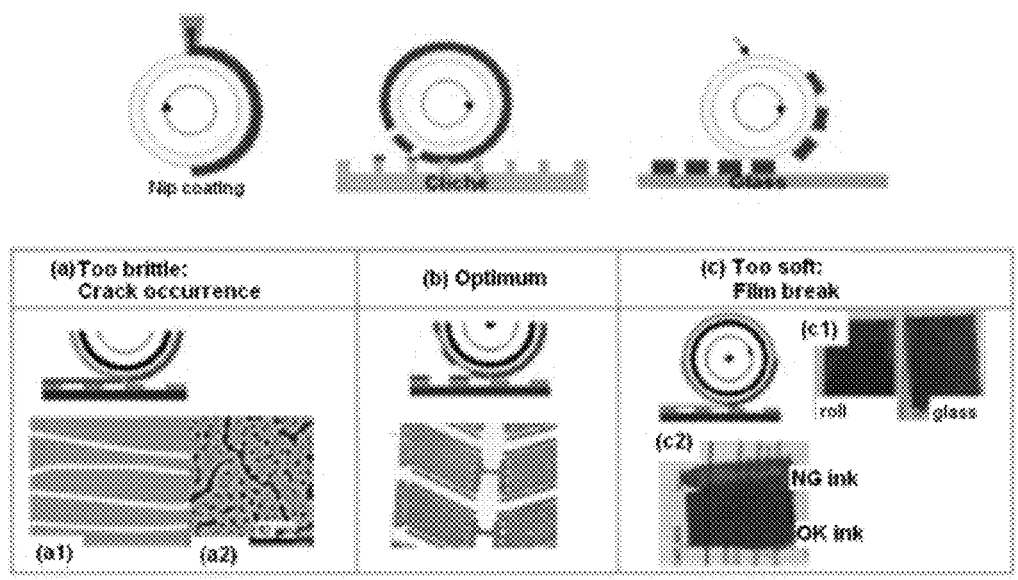
FIG. 1 shows schematic drawing and SEM images comparing a good pattern of the ink composition according to an embodiment of the present invention (b), with the cracks on the pattern prepared from the ink composition without including the coatability improving polymer (a), and an improper transfer of pattern onto the substrate (c).
Figure 2:
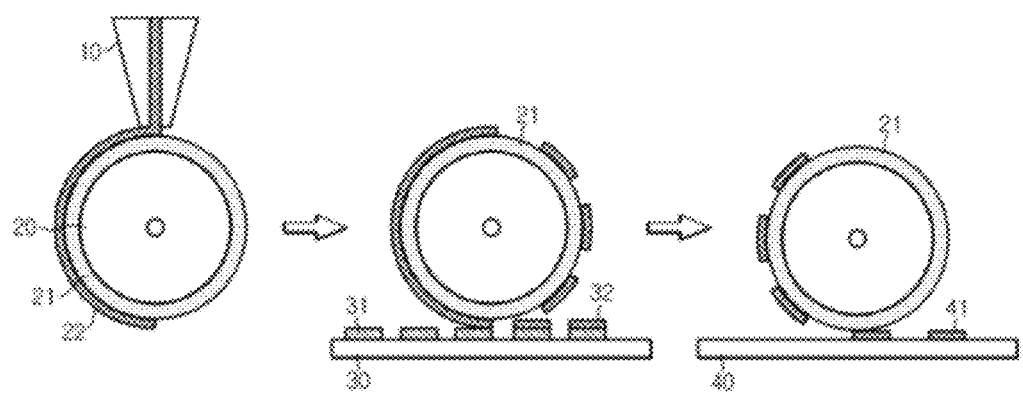
FIG. 2 is a schematic drawing showing a method of preparing the conductive pattern according to the roll printing method.

The present invention is further explained in more detail with reference to the following examples. These examples, however, should not be interpreted as limiting the scope of the present invention in any manner.

Example 1

Conductive Metal Ink Composition and Formation of Conductive Pattern 5 g of silver nanoparticle having an average diameter of 50 nm, 10 g of propyleneglycol methylether acetate (vapor pressure of 3.8 torr at 25° C.), 5 g of ethanol (vapor pressure of 59.3 torr at 25° C.), 4.84 g of ethyleneglycol monobutylether (vapor pressure 0.80 torr at 25° C.), 0.15 g of polydimethylsiloxane surfactant, 1 g of butylphenol aldehyde novolac resin as a phenol polymer and 0.06 g of polyurethanediol as a urethane polymer were mixed, agitated for 12 hours and filtered with a filter having a pore size of 1 μm to prepare the ink composition. The initial viscosity of the ink composition was measured according to the following method, and was 2.8 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 400° C. for 30 minutes in thermal furnace to obtain the conductive pattern.

Example 2

Conductive Metal Ink Composition and Formation of Conductive Pattern 5 g of silver nanoparticle having an average diameter of 50 nm, 2 g of propyleneglycol methylether acetate (vapor pressure of 3.8 torr at 25° C.), 5 g of ethanol (vapor pressure of 59.3 torr at 25° C.), 12.5 g of ethyleneglycol monobutylether (vapor pressure 0.80 torr at 25° C.), 0.15 g of polydimethylsiloxane surfactant and 0.5 g of butylphenol aldehyde novolac resin as a phenol polymer were mixed, agitated for 12 hours and filtered with a filter having a pore size of 1 μm to prepare the ink composition. The initial viscosity of the ink composition was measured according to the following method, and was 3.06 cPs.

The conductive pattern is formed using the ink composition according to the same method of Example 1.

Example 3

Conductive Metal Ink Composition and Formation of Conductive Pattern 5 g of silver nanoparticle having an average diameter of 50 nm, 2 g of propyleneglycol methylether acetate (vapor pressure of 3.8 torr at 25° C.), 8 g of ethanol (vapor pressure of 59.3 torr at 25° C.), 9.9 g of ethyleneglycol monobutylether (vapor pressure 0.80 torr at 25° C.), 0.15 g of polydimethylsiloxane surfactant and 0.1 g of polyurethanediol as a urethane polymer were mixed, agitated for 12 hours and filtered with a filter having a pore size of 1 μm to prepare the ink composition. The initial viscosity of the ink composition was measured according to the following method, and was 2.33 cPs.

The conductive pattern is formed using the ink composition according to the same method of Example 1.

Example 4

Conductive Metal Ink Composition and Formation of Conductive Pattern 6 g of silver nanoparticle having an average diameter of 50 nm, 1.2 g of propyleneglycol methylether acetate (vapor pressure of 3.8 torr at 25° C.), 3.0 g of ethanol (vapor pressure of 59.3 torr at 25° C.), 9.3 g of ethyleneglycol monobutylether (vapor pressure 0.80 torr at 25° C.), 0.15 g of polydimethylsiloxane surfactant and 0.5 g of butylphenol aldehyde novolac resin as a phenol polymer were mixed, agitated for 12 hours and filtered with a filter having a pore size of 1 μm, to prepare the ink composition. The initial viscosity of the ink composition was measured according to the following method, and was 3.78 cPs.

The conductive pattern is formed using the ink composition according to the same method of Example 1.

Example 5

Conductive Metal Ink Composition and Formation of Conductive Pattern 7.6 g of silver nanoparticle having an average diameter of 70 nm, 11.4 g of ethyleneglycol monoisopropylether (vapor pressure of 4.26 torr at 25° C.), 10.2 g of ethanol (vapor pressure of 59.3 torr at 25° C.), 2.0 g of diethyleneglycol monobutylether (vapor pressure 0.02 torr at 25° C.), 0.2 g of polydimethylsiloxane surfactant, and 0.3 g of glycerol ester of hydrogenated rosin (molecular weight 700) as a rosin-based resin were mixed, agitated for 12 hours and filtered with a filter having a pore size of 1 μm to prepare the ink composition. The initial viscosity of the ink composition was measured according to the following method, and was 2.65 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 450° C. for 10 minutes in thermal furnace to obtain the conductive pattern.

Example 6

Conductive Metal Ink Composition and Formation of Conductive Pattern 6.8 g of silver nanoparticle having an average diameter of 30 nm, 0.5 g of propyleneglycol methylether acetate (vapor pressure of 3.8 torr at 25° C.), 10.3 g of ethyleneglycol monopropylether (vapor pressure of 1.30 torr at 25° C.), 10.3 g of ethanol (vapor pressure of 59.3 torr at 25° C.), 1.1 g of diethyleneglycol monobutylether (vapor pressure 0.02 torr at 25° C.), 0.2 g of polydimethylsiloxane surfactant, and 0.2 g of benzylmethaacrylate-styrene-glycidyl methaacrylate-butylmethaacrylate copolymer as a acrylic polymer were mixed, agitated for 12 hours and filtered with a filter having a pore size of 1 μm to prepare the ink composition. The initial viscosity of the ink composition was measured according to the following method, and was 3.72 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 450° C. for 10 minutes in thermal furnace to obtain the conductive pattern.

Comparative Example 1

Conductive Metal Ink Composition and Formation of Conductive Pattern 5 g of silver nanoparticle having an average diameter of 50 nm, 10 g of propyleneglycol methylether acetate (vapor pressure of 3.8 torr at 25° C.), 5 g of ethanol (vapor pressure of 59.3 torr at 25° C.), 4.84 g of ethyleneglycol monobutylether (vapor pressure 0.80 torr at 25° C.), and 0.15 g of polydimethylsiloxane surfactant were mixed, agitated for 12 hours and filtered with a filter having a pore size of 1 μm to prepare the ink composition. The initial viscosity of the ink composition was measured according to the following method, and was 2.9 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 450° C. for 10 minutes in thermal furnace to obtain the conductive pattern.

Test Example 1

Measurement of Initial Viscosity of the Conductive Ink Composition

The initial viscosity of the ink compositions obtained in Examples 1 to 6, Comparative Example 1 were measured by using Brookfield viscometer and was shown as above.

Test Example 2

Test of Conductive Pattern Properties

The conductivity of each conductive pattern obtained in Examples 1 to 6 and Comparative Example 1 was tested by measuring the specific resistance of the conductive pattern. The specific resistance was calculated by multiplying the sheet resistance measured by 4 point probe (Mitsubishi chemical, MCP-T600) and the thickness measured by using alpha step. The obtained specific resistance was represented in Table 1.

Figure 3:
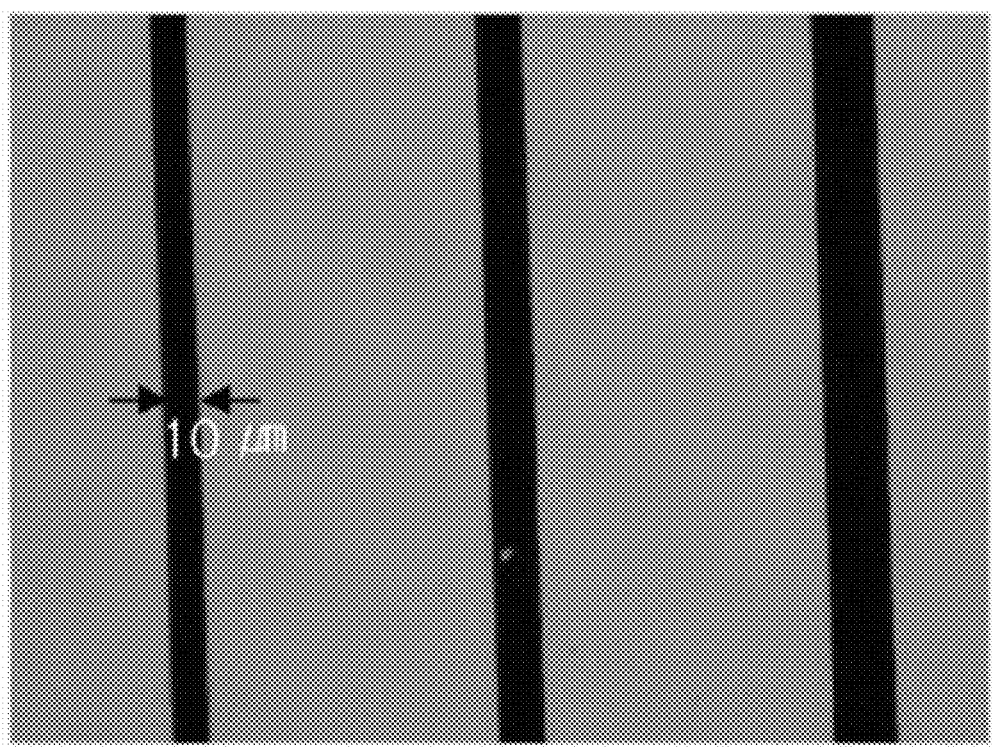
FIG. 3 is a SEM image of the conductive pattern obtained in Example 1.

The conductive pattern obtained in Example 1 was observed with a light microscope (Nikon, Eclipse 90i) and the microscopic image was shown in FIG. 3. FIG. 3 confirmed that the conductive pattern with line width of about 10 μm was satisfactorily formed by using the ink composition of Example 1. On the other hand, when the pattern with line width of about 10 μm was formed by using the ink composition of Comparative Example 1 which did not include the coatability improving polymer, the pattern of ink composition on the roller could not be transferred favorably to the substrate and thus the specific resistance, the conductivity and the height of the pattern (line height) could not be tested, as shown in FIG. 1(c).

The line heights of the conductive patterns obtained in Examples 1 to 6 and Comparative Example 1 were measured with a light microscope and the results were shown in Table 1.

TABLE 1

|  | Specific Resistance (μΩ · cm) | Line height (nm) |
| --- | --- | --- |
| Example 1 | 67.05 | 187 |
| Example 2 | 150.24 | 153 |
| Example 3 | 17.04 | 212 |
| Example 4 | 66.61 | 298 |
| Example 5 | 6.10 | 423 |
| Example 6 | 5.63 | 375 |
| Comparative Example 1 | No measurement | No measurement |

Referring to Table 1, the specific resistance and the line height confirmed that the good fine pattern with small line width and excellent conductivity could be formed by using ink compositions of Examples 1 to 6.

The invention claimed is:

1. A conductive metal ink composition which comprises a conductive metal powder; a non-aqueous solvent comprising a first non-aqueous solvent having a vapor pressure of 3 torr or lower at 25° C. and a second non-aqueous solvent having a vapor pressure of higher than 3 torr at 25° C.; and a coatability improving polymer, and which is used for forming a conductive pattern, by being printed on a substrate with a roll-printing process, wherein the first non-aqueous solvent comprises at least one nonvolatile solvent selected from the group consisting of propylene glycol, glycerol, propylene glycol propylether, ethyleneglycol monophenylether, ethyleneglycol monoisopropylether, ethyleneglycol monobutylether, propyleneglycol monobutylether, diethyleneglycol monobutylether, diethyleneglycol monobutylether acetate, diethyleneglycol ethylether, N-methylpyrrolidone, hexadecane, pentadecane, tetradecane, tridecane, dodecane, undecane, decane, DMSO, acetonitrile and butylcellosolve, wherein the coatability improving polymer comprises at least an adhesive polymer selected from the group consisting of epoxy-based polymer, phenol-based polymer, alcohol-based polymer, urethane-based polymer, ethylene vinyl acetate, rosin-based resin, acrylic polymer, styrene-butadiene-styrene-based polymer and polyester-based polymer, and wherein the composition comprises 15 to 30 wt % of the conductive metal powder; 5 to 70 wt % of the first non-aqueous solvent; 10 to 75 wt % of the second non-aqueous solvent; 0.1 to 5 wt % of the coatability improving polymer; and 0.01 to 4 wt % of surfactant, on the basis of total weight of the composition.

2. The conductive metal ink composition of claim 1, wherein the composition is used for forming an electrode of flat panel display device.

3. The conductive metal ink composition of claim 1, wherein the conductive metal powder comprises at least one metal powder selected from the group consisting of silver (Ag), copper (Cu), gold (Au), chrome (Cr), aluminum (Al), tungsten (W), zinc (Zn), nickel (Ni), iron (Fe), platinum (Pt) and lead (Pb).

4. The conductive metal ink composition of claim 1, wherein the conductive metal powder has an average particle diameter of 1 to 100 nm.

5. The conductive metal ink composition of claim 1, wherein the second non-aqueous solvent comprises at least a volatile solvent selected from the group consisting of alcohol-based solvent, glycol ether-based solvent, glycol ether ester-based solvent, ketone-based solvent, hydrocarbon-based solvent, lactate-based solvent, ester-based solvent, aprotic sulfoxide-based solvent, and nitrile-based solvent, which have a vapor pressure of higher than 3 torr at 25° C.

6. The conductive metal ink composition of claim 1, wherein the second non-aqueous solvent comprises at least a volatile solvent selected from the group consisting of methanol, ethanol, propanol, isopropanol, n-butanol, t-butanol, pentanol, hexanol, nonan, octane, heptane, hexane, acetone, methylethylketone, methyl isobutyl ketone, methyl cellosolve, ethyl cellosolve, ethylene glycol dimethylether, ethyleneglycol diethylether, propyleneglycol methylether acetate, chloroform, chloromethylene, 1,2-dichloroethane, 1,1,1-trichloroethane, 1,1,2-trichloroethane, 1,1,2-trichloroethene, cyclohexane, tetrahydrofuran, benzene, toluene and xylene.

7. The conductive metal ink composition of claim 1, wherein the composition has an initial viscosity of 10 cPs or lower.

8. A method of forming a conductive pattern, comprising the steps of:

coating a conductive metal ink composition according to claim 1 on a roller;

forming a pattern of the ink composition corresponding to the conductive pattern on the roller, by contacting the roller with a cliché which has intaglio pattern corresponding to the conductive pattern;

transferring the pattern of the ink composition on the roller onto a substrate; and sintering the transferred pattern on the substrate.

9. The method of forming a conductive pattern of claim 8, wherein the conductive pattern is an electrode pattern of flat panel display device.

10. The method of forming a conductive pattern of claim 9, wherein the conductive pattern has a line width of 3 to 10 μm.

11. The method of forming a conductive pattern of claim 8, wherein the conductive pattern has a line width of 3 to 10 μm.

* * * * *